United States Patent
Frei et al.

(10) Patent No.: US 7,411,458 B2
(45) Date of Patent: Aug. 12, 2008

(54) METHOD AND APPARATUS FOR CONTROLLING AN OUTPUT VOLTAGE IN A POWER AMPLIFIER

(75) Inventors: Jeffrey A. Frei, Hawthorn Woods, IL (US); Enver Krvavac, Lake Zurich, IL (US)

(73) Assignee: Motorola, Inc., Schaumburg, IL (US)

(*) Notice: Subject to any disclaimer, the term of this patent is extended or adjusted under 35 U.S.C. 154(b) by 42 days.

(21) Appl. No.: 11/345,573

(22) Filed: Feb. 1, 2006

(65) Prior Publication Data

US 2007/0176688 A1 Aug. 2, 2007

(51) Int. Cl.
*H03F 3/04* (2006.01)

(52) U.S. Cl. .................................. 330/302; 330/306

(58) Field of Classification Search ......... 330/302–303, 330/306, 298, 207 P
See application file for complete search history.

(56) References Cited

U.S. PATENT DOCUMENTS

| | | | | |
|---|---|---|---|---|
| 6,177,841 B1 * | 1/2001 | Ohta et al. | .................. | 330/302 |
| 6,400,240 B2 * | 6/2002 | Nishida et al. | .............. | 333/245 |
| 6,724,263 B2 * | 4/2004 | Sugiura | ...................... | 330/302 |
| 6,759,908 B2 * | 7/2004 | Gotou et al. | ................. | 330/302 |
| 7,084,708 B2 * | 8/2006 | Sugiura et al. | .............. | 330/302 |
| 7,161,434 B2 * | 1/2007 | Rhodes | ....................... | 330/302 |

* cited by examiner

*Primary Examiner*—Robert Pascal
*Assistant Examiner*—Hieu P Nguyen
(74) *Attorney, Agent, or Firm*—Valerie M. Davis

(57) ABSTRACT

Power amplifier (PA) apparatus that includes: a PA device operating at a fundamental frequency and having a maximum operating frequency that is higher than the fundamental frequency, an output current having a fundamental component at the fundamental frequency and a plurality of harmonic components at different harmonic frequencies of the fundamental frequency, and an output voltage based on the output current; a first matching circuit coupled to the PA device and corresponding to the fundamental component; and a second matching circuit coupled between the PA device and the first matching circuit and corresponding to at least one of the harmonic components, wherein the first and second matching circuits maintain the PA output voltage at a value that is no more than a predetermined maximum value, which is less than a breakdown voltage for the PA device.

15 Claims, 6 Drawing Sheets

METHOD AND APPARATUS FOR CONTROLLING AN OUTPUT VOLTAGE IN A POWER AMPLIFIER

FIELD OF THE INVENTION

The present invention relates generally to power amplifier design and more specifically to designing an output match network to control the output voltage of a power amplifier to prevent destruction of a power transistor comprised therein.

BACKGROUND OF THE INVENTION

Radio frequency (RF) devices, e.g., RF transistors and RF power amplifiers ("PAs") containing RF power transistors, are used in a wide variety of communications and other electronic applications, such as cellular handsets and base radio repeaters. RF power amplifiers are typically made up of one or more cascaded amplifier stages, each of which increases the level of the signal applied to the input of that stage by an amount known as the gain of the stage. It should be noted that the terms RF device, PA device and power transistor device are used herein interchangeably to describe a device that includes one or more power transistors operating as a power amplifier in an application.

In recent years, manufactures of PA apparatus that includes a PA device comprising one or more power transistors have generally focused efforts on increasing the maximum operating frequency of those devices to accommodate higher frequency markets such as, for instance, 2 GHz markets. Companies that develop applications that span a range of operating frequencies may, for reasons such as leveraging volume and cost considerations, desire to use a single PA design, transistor or power-integrated circuit (IC) 'device' for all or a significant portion of their applications. However, designers are confronted with a new challenge when using readily available power amplifier devices in "lower frequency designs" than what the power amplifier or device is otherwise capable of or intended for. A power transistor device within the power amplifier can self-destruct as the amplifier output power is increased. This self-destruction phenomenon is also referred to as a "lack-of-ruggedness" and can occur at power levels of varying degrees below the power level at which the device is rated.

FIGS. 1 and 2 will be used to further describe this self-destruction phenomenon. FIG. 1 illustrates exemplary power amplifier apparatus 100 as described above that may be used in applications having a maximum operating frequency of 1 GHz for instance. Apparatus 100 comprises at least one power transistor 110 that functions as a power amplifier and a matching network 120 connected to the output of transistor 110. In this illustrated embodiment, power transistor 110 is a power field effect transistor (FET) such as a lateral diffused metal-oxide-semiconductor (LDMOS) transistor having a drain at a node 112, a gate at a node 114 and a source at a node 116. The matching network 120 is connected to nodes 112 and 116.

In operation, the gate of transistor 110 is coupled to an RF input waveform at a given fundamental or main frequency, which typically comprises an RF carrier modulated with information to be communicated over the air or a cable. Transistor 110 then generates an amplified RF signal at its output, which creates a voltage response between the drain and source ($V_{ds}$). $V_{ds}$ is a function of a drain current $I_d$ generated in the transistor and an impedance, which is based on matching network 120 as "seen" by $I_d$. Generally, $I_d$ comprises a spectral component at the fundamental frequency (also referred to herein as the fundamental component) and spectral component(s) at one or more harmonic frequencies (also referred to herein as harmonic components), where a harmonic frequency is defined as an integral (whole-number) multiple of the fundamental frequency.

In a typical application, transistor 110 is operated near its maximum operating frequency. Therefore, it is usually sufficient to design matching network 120 to correspond to or "dominate" only the fundamental component of $I_d$ to cause the transistor to operate within whatever design specifications are required for the application. Dominate herein means to specifically or overtly load a given spectral component of the output current of a PA device with a desired impedance to create a corresponding desired spectral component of the voltage response at the output of the PA device. Those skilled in the art will realize that in a physical circuit impedance is affected by many factors. In addition, the impedance is the inverse of a complex admittance value, wherein the real part of the admittance value is directly related to the slope of the load line.

FIG. 2 illustrates an exemplary $V_{ds}$ output waveform 220 generated by transistor 110 over time where transistor 110 is being operated at a fundamental frequency that is substantially less than the maximum operating frequency of the transistor. In this illustration, transistor 110 has a $V_{ds}$ specification (or maximum breakdown voltage rating) of about 65 volts and is being operating at a fundamental frequency in the VHF frequency range, in this case about 146 MHz. However, as FIG. 2 shows, operating the transistor in this manner generates a $V_{ds}$ output waveform 220 comprising high instantaneous voltage peaks (e.g., 222 and 224) that exceed the maximum $V_{ds}$ voltage specification of the transistor. These voltage peaks are caused by the additive effects of harmonic component(s) of $I_d$, in turn generating harmonic $V_{ds}$ components, and are what causes transistor 110 to self-destruct when it is being operated at certain frequencies that are less than the maximum operating frequency of the transistor. In other words, the power transistor has available gain at a number of harmonics, which may create the undesirable time-domain RF voltage waveform. Currently, there exists no suitable method for the application designer to address this lack-of-ruggedness problem.

Embodiments of the present invention as described below in detail provide for techniques that address the need for eliminating elevated peaks in the $V_{ds}$ output voltage of a power transistor that exceed the maximum break down voltage of the transistor to enable it to be operated for a larger range of frequencies that are substantially lower than a given predetermined maximum operating frequency of the transistor.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF EMBODIMENTS OF THE INVENTION

Figure 1:
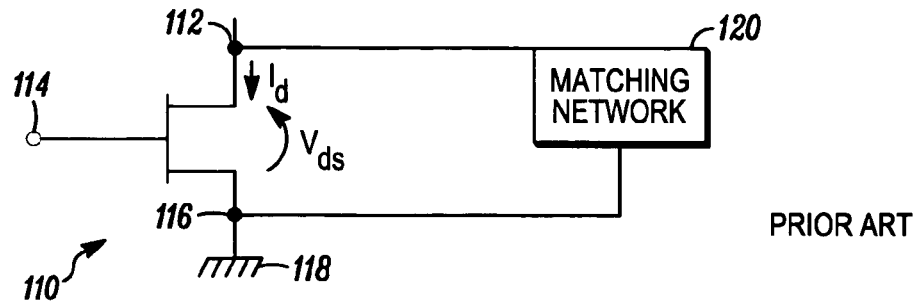
FIG. 1 illustrates prior art power amplifier apparatus.

Before describing in detail embodiments that are in accordance with the present invention, it should be observed that the embodiments reside primarily in combinations of method steps and apparatus components related to a method and apparatus for controlling an output voltage in a PA. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Generally speaking, pursuant to the various embodiments, an output or matching network is described that corresponds to and is designed to dominate not only the fundamental component of the output current of a power transistor device but also to dominate one or more harmonic components of that output current. The output network effectively wave shapes the output voltage generated by the spectral components of the output current of the power transistor device to maintain the output voltage below a predetermined threshold that is no more than the breakdown voltage of the transistor. This enables the power transistor device to be operated in a larger ranger of frequencies below the maximum operating frequency of the power transistor than is possible if the novel output network is not used. Those skilled in the art will realize that the above recognized advantages and other advantages described herein are merely exemplary and are not meant to be a complete rendering of all of the advantages of the various embodiments of the present invention.

Figure 3:
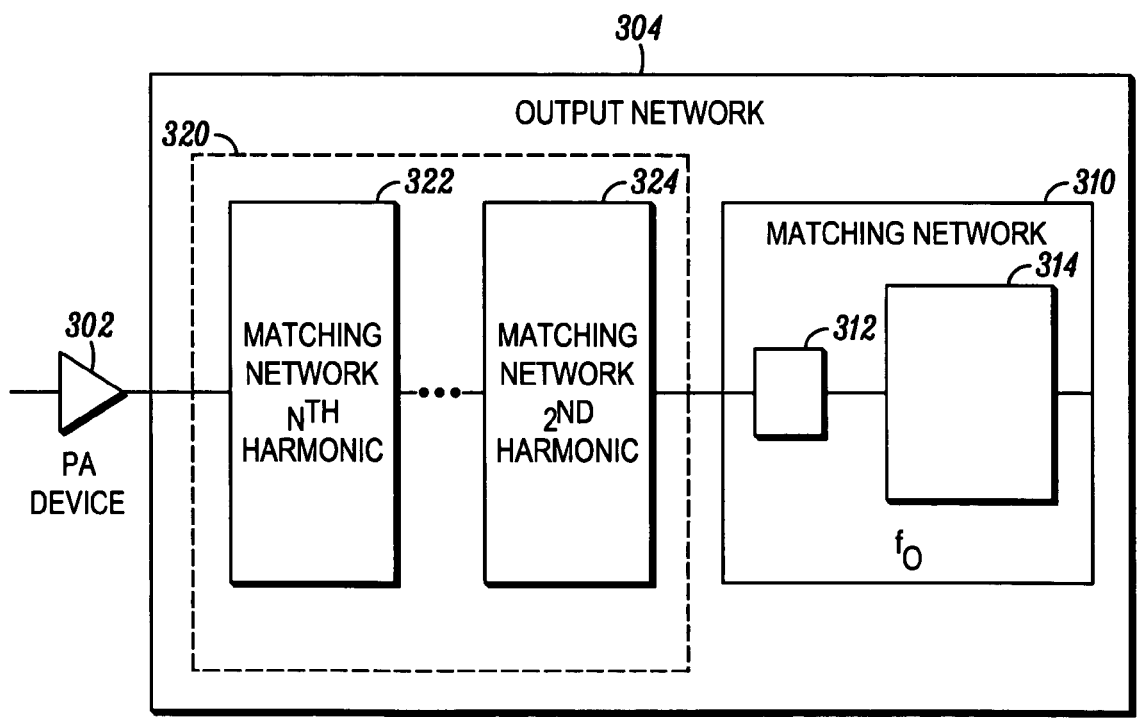
FIG. 3 illustrates power amplifier apparatus in accordance with embodiments of the present invention.

Referring now to the drawings, and in particular FIG. 3, power amplifier apparatus in accordance with embodiments of the present invention is shown and indicated generally at 300. PA apparatus 300 may be included on a circuit board and further incorporated into a communication application such as, for instance, base radio apparatus. PA apparatus 300 comprises a PA device 302 and an output network 304 operatively coupled to the PA device 302 usually using suitable wires, the output network 304 being in accordance with various teachings herein and operating to maintain an output voltage of PA device 302 at a value that is no more than a predetermined maximum value, which is less than a breakdown voltage for the PA device.

PA device 302 may be any suitable PA device that includes one or more PA stages. For example, PA device 302 in an exemplary embodiment is included in an integrated circuit (IC) design and includes a first and at least a second amplifier stage operatively coupled together usually using suitable wires on the IC. Each amplifier stage comprises a power transistor such as an LDMOS FET similar to the one described by reference to transistor 110 illustrated in FIG. 1.

Those skilled in the art, however, will recognize and appreciate that the specifics of this illustrative example are not specifics of the invention itself and that the teachings set forth herein are applicable in a variety of alternative settings. For example, since the teachings described do not depend on the type of PA device used or the number of stages in the PA device, they can be applied to any type of—PA device such as one comprising one or more bipolar or other type of transistors, and such alternative implementations are contemplated and are within the scope of the various teachings described herein.

As stated above, apparatus 300 further comprises output network 304 operatively coupled to PA device 302. In an exemplary and practical embodiment with a PA device having multiple stages, output network 304 is connected via suitable wiring to the final stage LDMOS FET of PA device 302. In one embodiment, the output network is included on the same circuit board as the PA device but not on the PA device's IC. However, the teachings herein are by no means limited to such an embodiment, and the entire output network or a portion thereof could be included on the PA device's IC. In addition, those of ordinary skill in the art will realize that a matching network in accordance with the teachings herein is not limited to being implemented in conjunction with and coupled only to the final stage power transistor (as described herein). Theoretically, if desired, a matching network having portions that are designed to correspond to harmonic components of a power transistor output current can be implemented with any of the power transistors in any one or more of the amplifier stages of the PA device.

Output network 304 generally comprises a matching network 310 and a matching network 320 coupled between matching network 310 and PA device 302. Matching network 310 corresponds to and is designed to dominate the fundamental component of the output (in this case the FET device drain) current of the final stage LDMOS FET in PA device 302 with little regard for overtly loading the harmonic components of the total output current. Matching network 320 corresponds to and is designed to dominate one or more harmonic components of the drain current of interest with little regarding for overtly loading other harmonic components (not of interest) or the fundamental component of the total output current.

Matching network 310 is a circuit comprising a portion 312 and a portion 314 as described below. Portion 314 is conventional matching network circuit design familiar to any amplifier designer of ordinary skill in the art. Its design handles most of the job of the 'fundamental'-match and is designed to enable the amplifier to meet ordinary specifications such as Gain, Efficiency, and Linearity. Portion 312 may be optionally used to increase immunity and isolation to matching network 320 from loading variation imparted by the outside world, e.g., from an antenna comprising the application that includes the PA apparatus, which helps section 320 to work in a more controlled manner. Matching network 310 may be designed using any suitable means. Conventional circuit design programs may be used that are commercially available such as, for instance, Agilent's "ADS" or Applied Wave Research's "Microwave Office®". Since matching network design in general is widely known by those of ordinary skill in the art further discussion of matching network design is not included here for the sake of brevity.

Returning to matching network 320, as stated above generally the drain current comprises a number of harmonic components (theoretically an infinite number of harmonic components in accordance with the well known trigonometric representation of Fourier series of periodic waveform). However, not all of the harmonic components substantially affect the $V_{ds}$ of the transistor device. In the embodiment of matching network 320 shown in FIG. 3, there is a separate portion corresponding to and designed to dominate each of the one or more harmonic components of the drain current determined by a designer of the apparatus to substantially affect the output voltage $V_{ds}$, in this case. It should be realized that although a matching network or matching portion may be designed to dominate a particular component in an output signal, complete independence of each matching network or matching portion is not fully achieved in a physically realizable circuit. However, this in no way minimizes the teachings described herein.

FIG. 3 shows output network 320 having portions (e.g., 322 and 324) that correspond to the second through the nth harmonic components of the drain current. It should be noted that such an embodiment is exemplary and that matching network 320 could have a single portion that corresponds to a single harmonic component. The matching network 320 could correspond to even harmonic components (e.g., $2^{nd}$, $4^{th}$, etc.), odd harmonic components (e.g., $3^{rd}$, $5^{th}$ etc.) or a combination of both depending on the application. In this embodiment, the matching network 310 corresponding to the fundamental component of the output current is coupled farthest from the PA device output. Moreover, the matching network portions (e.g., 322, 324) of matching network 320 are coupled with respect to the PA device 302 based on the frequency level of the harmonic component to which the matching network portion corresponds.

Accordingly, the lower the harmonic frequency the farther away from the PA device its corresponding matching network portion is coupled and the higher the harmonic frequency, the closer to the PA device its corresponding matching network portion is coupled. This is because it will take only weak affects (and small component values in concert with parasitics) to impact the components having the highest frequencies of interest. Phase shift is also greatest at the highest frequencies; excessive shift in phase will limit the bandwidth over which the harmonic termination impedance goal may be obtained. And both lower frequency harmonics and the fundamental frequency will be only weakly affected by these components. For this reason, it is desirable that the highest frequencies of need be dealt with closer to the transistor device. This pattern continues as one moves away from the transistor device until the circuit components farthest away deal primarily with the fundamental component.

The number of harmonic components considered in the design of matching network 320 is based (at least in part) on the difference between the intended frequency of operation of the PA device and the corresponding maximum operating frequency of such device. As one would suspect, usually as this difference increases, the number of harmonic components which would require a corresponding matching network portion increases. There are several considerations in determining how many harmonics to overtly address. 'How many' to address ultimately depends on the harmonic content generated and whether the time-domain representation of this spectrum can put the device in breakdown jeopardy. The 'harmonics generated' is, in turn, impacted by the device's ability to create spectral content at a given set of frequencies, the chosen bias point of the amplifier (class of operation), whether the device is driven into saturation, and the beta and transducer cutoff frequencies of the device. The latter have much to do with 'finger structure', doping profiles, and minute parasitics that are present.

A very common class of amplifiers for power amplification is Class B. For an ideal Class B case, Fourier Series representation depicts only even harmonic content beyond the fundamental—with the amplitude of the lowest evens being most prevalent. At some point there is a very diminished return (therefore, need) for addressing harmonics beyond a certain frequency. Continuing with that case—if the device is to be operated multiple octaves below its touted capability—it may be entirely possible that overt attention be paid to $2^{nd}$, $4^{th}$, $6^{th}$, or beyond. Certainly an octave lower than manufacturer-specified operation will be a trigger point to employ the IP for device ruggedness, though this is not a universal statement. Nonlinear modeling is a powerful tool in making the final determination. An inverse Fourier transform can be done and the circuit assembled and measured with a (very fast) scope for correlation and to verify success.

Figure 4:
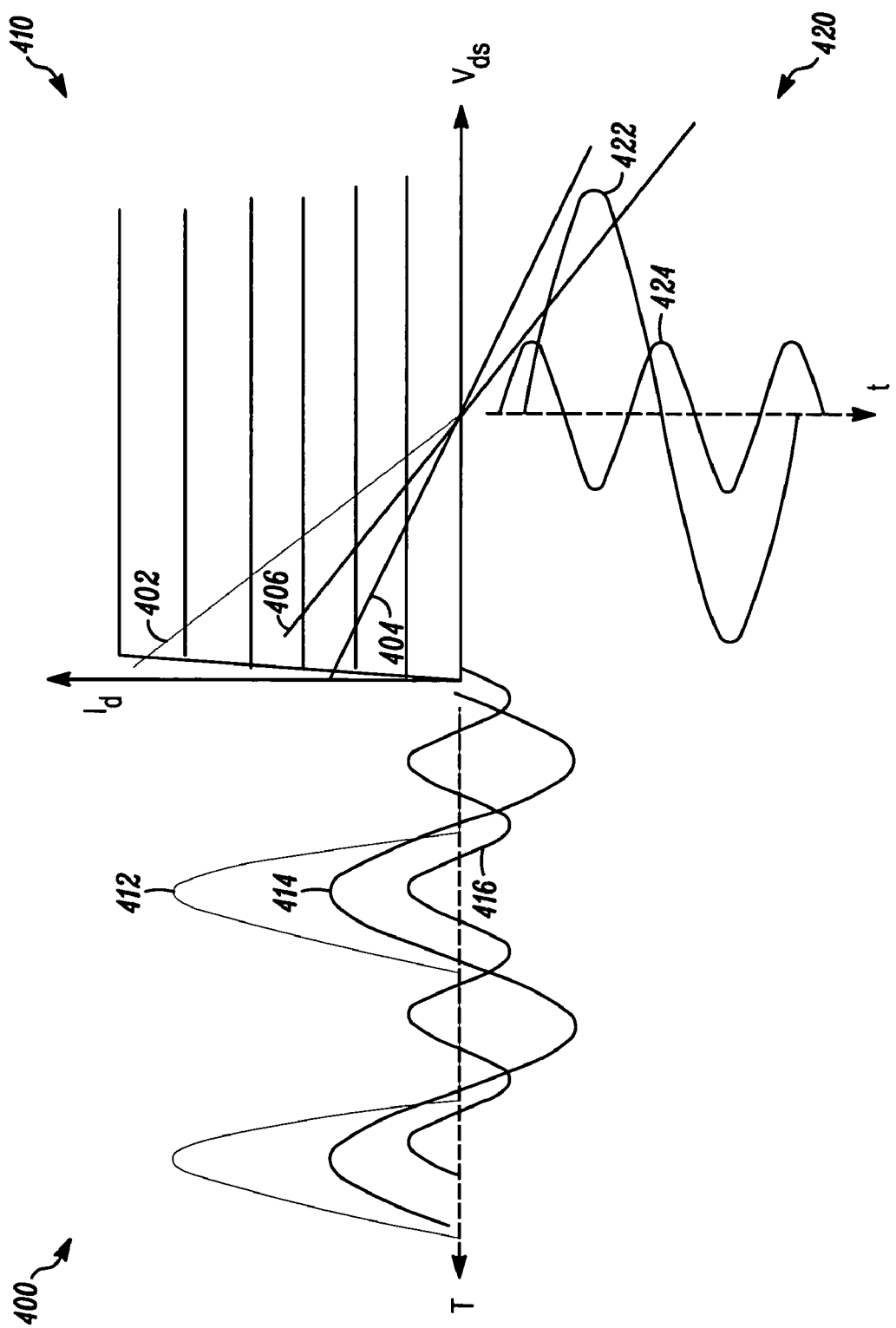
FIG. 4 illustrates output waveforms corresponding to the power amplifier apparatus illustrated in FIG. 3.

Turning now to FIG. 4 for further explanation, graphs and waveforms illustrating operation of a class B single-ended LDMOS FET amplifier is shown and generally indicated at 400, 410, and 420. For purposes illustrating a practical example, let us say that the final stage power transistor in PA device 302 to which output network 304 is coupled has characteristics similar to those of transistor 110 described above and is operating in accordance with waveforms 400, 410, 420. Accordingly the LDMOS FET transistor has a maximum operating frequency of about 1 GHz, a $V_{ds}$ specification (or maximum breakdown voltage rating) of about 65 volts and is being operating at a fundamental frequency in the VHF frequency range, in this case about 146 MHz.

Figure 2:
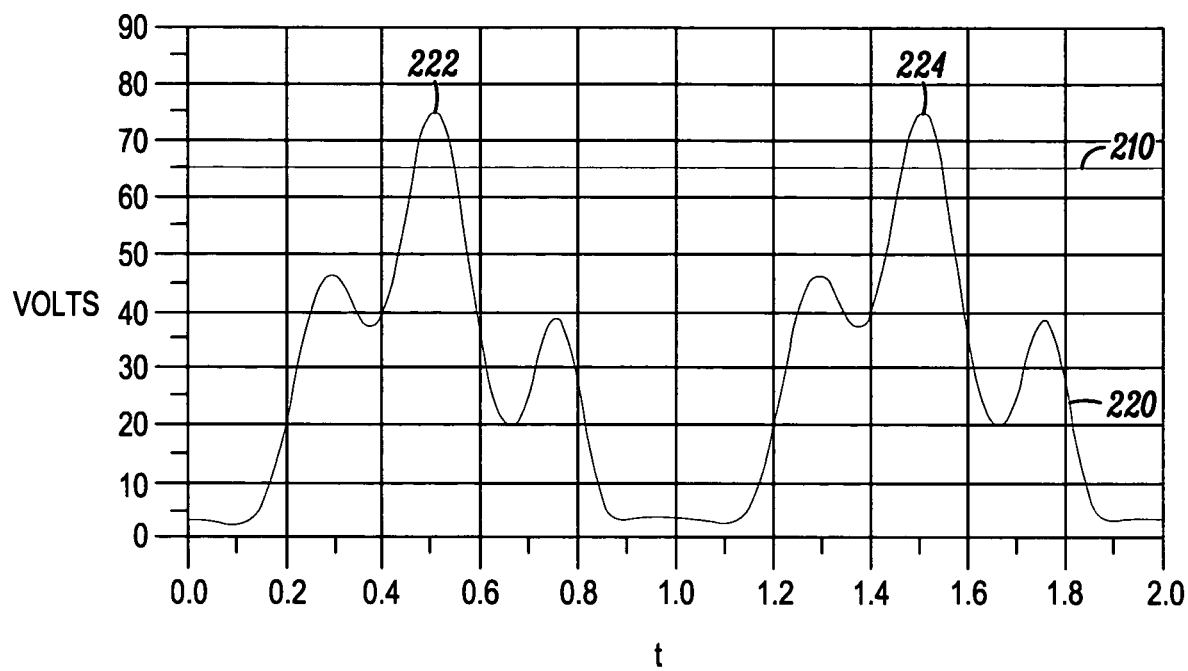
FIG. 2 illustrates a prior art $V_{ds}$ waveform corresponding to the power amplifier apparatus illustrated in FIG. 1.

Graph 410 shows an operating line 402 of the transistor with the transistor's drain current ($I_d$) plotted on one axis against its RF output voltage ($V_{ds}$) on the other axis. Also shown to the left of graph 410 are waveforms 400 representing the transistor's drain current over time. Waveform 412 is the raw, total current in this example. Illustrated therein is a fundamental component of 412, shown as 414, at the fundamental frequency and a single harmonic component 416 at the $2^{nd}$ harmonic of the fundamental frequency in this case. In reality there are a plurality of harmonic components that exist. However, only one, 416, is shown for ease of illustration. Further shown to the bottom of graph 410 are waveforms 420 representing RF output voltage waveform components for the transistor corresponding to the drain current components. Thus, shown in this illustration is a RF voltage waveform 422 corresponding to the fundamental component 414 of the drain current and a RF voltage waveform 424 corresponding to the $2^{nd}$ harmonic component 416. The voltage waveform corresponding to the $4^{th}$, and all other higher harmonic components present in the drain current, is not shown for ease of illustration. The superposition of waveforms 422, 424 and waveforms associated with other harmonic components generates a total RF $V_{ds}$ output waveform of the transistor (e.g., as illustrated in FIG. 2).

In general the total current (comprising the fundamental component and all of the harmonic components) and the load seen by each component of the total current is what determine the total output voltage waveform. Further shown in FIG. 4 are a load line 404 representing the load seen by the fundamental component 414 and a load line 406 seen by the $2^{nd}$ harmonic component 416. More particularly, the inverse of the slope of each load line (e.g., 406) characterizes the impedance that loads the corresponding current spectral component (e.g., 416) to generate the corresponding voltage spectral component (424). In effect, by incorporating matching network 320 in accordance with the teachings herein the load lines (e.g., 406), or more particularly the slopes of those load lines, corresponding to the harmonic components are controlled to reduce their contribution to the RF energy in the overall RF output voltage.

In designing output network 304, the goal as mentioned above is to control output RF voltage of the PA device such that it remains within a predetermined maximum voltage (which is less than the breakdown voltage of the PA device) during operation of the PA device. More specifically, the goal is to "wave-shape" the RF output voltage waveform (e.g., waveform 220) to ideally broaden and lower the absolute peaks (e.g., 222, 224) of the waveform while keeping the fundamental RF energy substantially the same. Thus, the desired effect is that substantially the same RF energy is contained at the fundamental frequency and less at the harmonic frequencies.

The following design principles may be used to design the output network 304 to achieve the above-referenced desired effect. The time domain representation of the total $V_{ds}$ waveform is complex in its shape, and is a superposition of contributors related to energy in corresponding frequency spectral components—the key word being 'superposition'. A first step in the methodology solution is to determine amplifier fundamental frequency load points (impedances) that are appropriate—not only for parametric performance such as Gain, Efficiency, or Linearity requirements—but to allow the amplifier to make the required output power level with a peak value of the fundamental component of $V_{ds}$ that is not excessively high when generating the required output power. In FIG. 1, matching network 120 must achieve this, and in FIG. 3, matching network 310 is desirably designed to achieve this. If the fundamental frequency impedances are not unnecessarily large, this will be of direct benefit to a reduction of the peak instantaneous voltage of the superposition-waveform. This means that the slope of the fundamental-load-line 404 is steep enough to achieve the aforementioned.

However, this step alone does not solve the problem of damaging peak voltages shown in FIG. 2 at 222 and 224. Again we recognize superposition. Time domain components relating to harmonics of the drain current in FIG. 1 '$I_d$' will interact with network-generated load lines (e.g., 406) to produce corresponding time-domain voltage waveform components (e.g., 424). These network-generated load lines exist—whether overtly designed or not. In accordance with the teachings herein, those load lines are made sufficiently steep so that the voltage function amplitude generated by each significantly-contributing component is kept controllably small.

Figure 6:
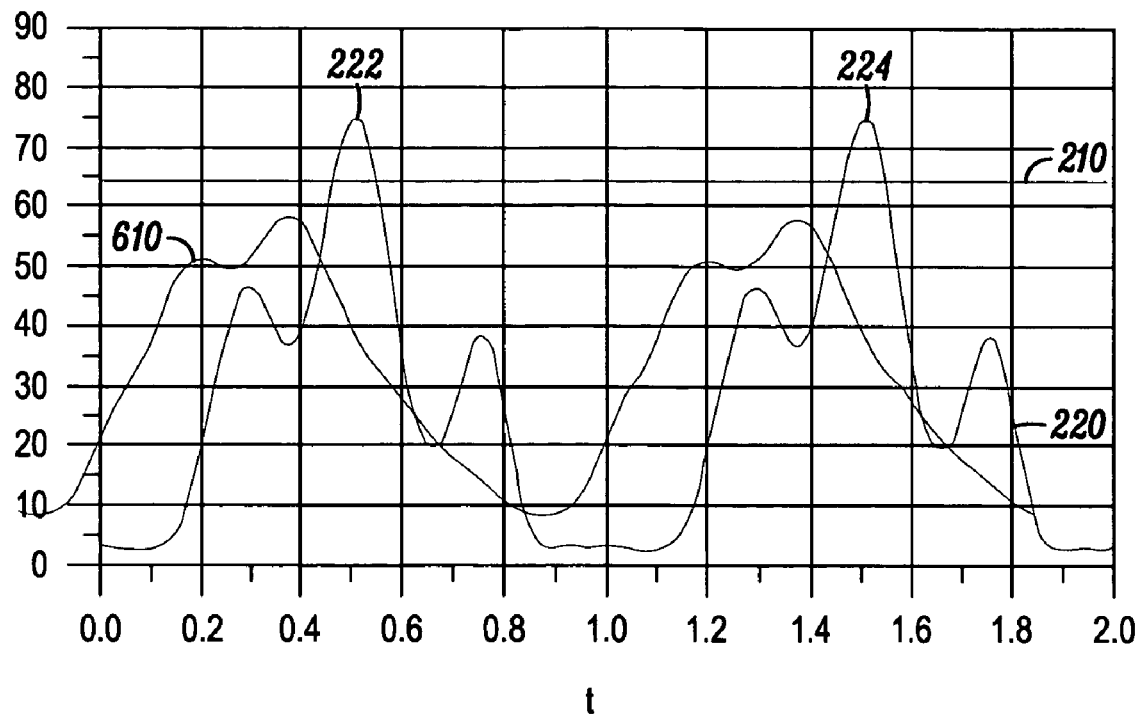
FIG. 6 illustrates the prior art $V_{ds}$ shown in FIG. 2 and a $V_{ds}$ waveform corresponding to the power amplifier apparatus illustrated in FIGS. 3 and 5.

In FIG. 3, output network 304 can be designed to achieve these sets of goals. Matching network 310 is primarily responsible for the fundamental impedance termination. Matching portions such as 322 and 324 overtly set the load-line slopes that the harmonic currents of $I_d$ have to work against. When this is done properly the $V_{ds}$ waveform 220 of FIG. 2 becomes more benign, akin to the waveform 610 of FIG. 6. Thus, with application of the teachings described herein, it is noted that the $V_{ds}$ wave has been shaped to a new wave that substantially retains the same level of fundamental power for the customer. Most importantly it is noted that 610, at its peak, remains below the breakdown point of the transistor device indicated by 210. As stated earlier, it is the peaks at 222 and 224 that cause irreparable failure of the transistor.

Figure 5:
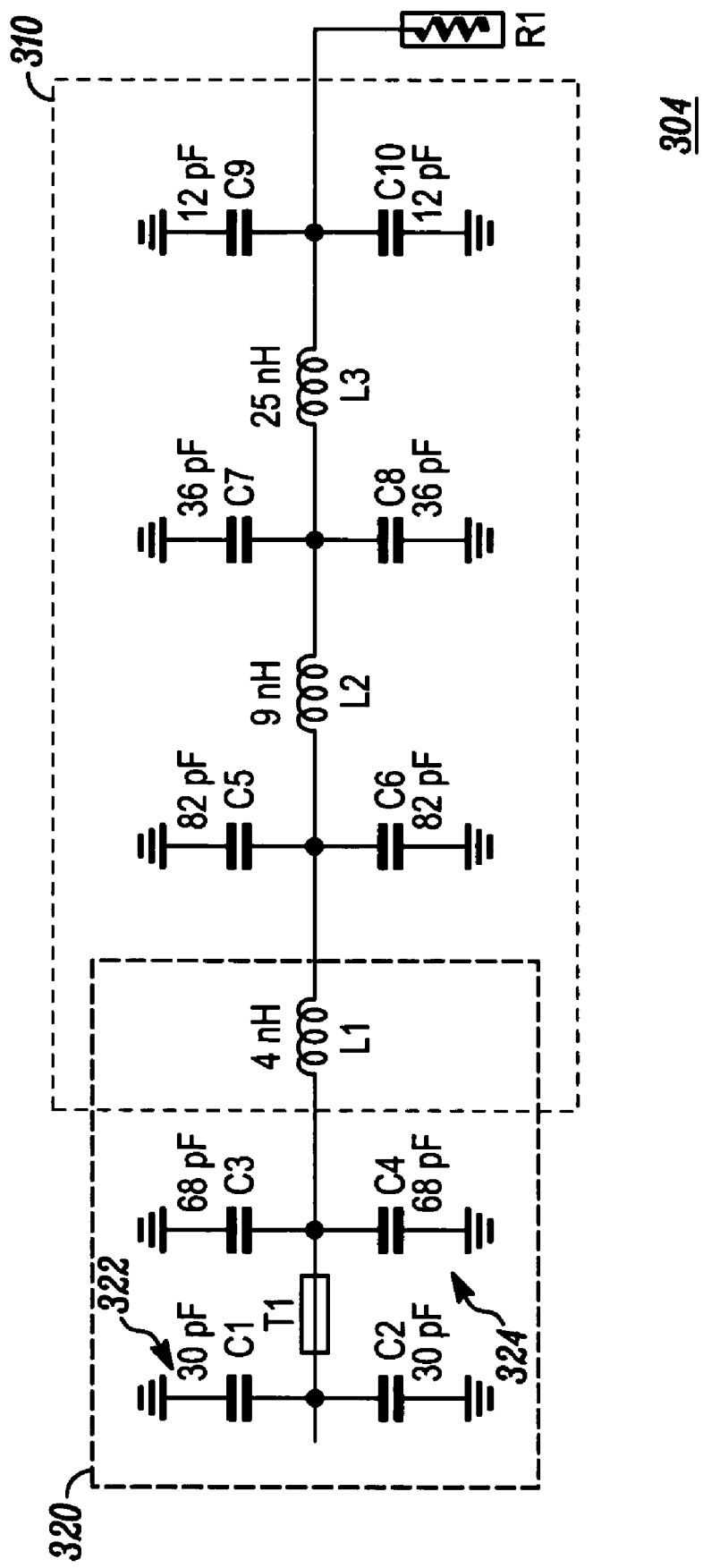
FIG. 5 illustrates an exemplary output network in accordance with embodiments of the present invention.

FIG. 5 illustrates an exemplary output network 304 comprising matching networks 310 and 320, where output network 304 was contrived, modeled, physically built, and coupled to an actual PA device for which it was designed. $V_{ds}$ measurements were made on the physical circuit and agreed well with modeled prediction. Output network 304 is coupled to a PA device (not shown in FIG. 5) that has the following exemplary characteristics. The PA apparatus operates in the 150 MHz regime with a finite bandwidth of operation extending somewhat above and below this nominal fundamental frequency. This apparatus uses a power device touted for 1 GHz operation, and known to roll off sharply above that frequency, and the operation of the device is near Class-B, As stated earlier matching network 310 is conventional and is familiar to one of ordinary skill in the art, and is generally designed to match the power amplifier device to the outside world (in a typical embodiment, 50 ohms impedance as illustrated by R1). Referring again briefly to FIG. 4, network 310 sets the slope of fundamental load line 404. Network 310 comprises a plurality of capacitive elements (e.g., C5, C6, C7, C8, C9 and C10) and a plurality of inductive elements (e.g., L1, L2 and L3, with L1 functioning as portion 312 in FIG. 3) operatively connected together and to network 300 in the exemplary manner shown in FIG. 5. It should be noted that, typically, the capacitive values of these capacitive elements decrease as the distance or proximity (topologically) of the capacitive element from the PA device increases.

There is flexibility and generally many factors that determine how the network section corresponding to the fundamental component will be manifested. 'Fundamental' is a key word. The stated capacitive value trend is true in our example, but need not strictly be the case. There are several points. For the case of a high-power power amplifier stage the device impedance will be low (compared to the outside world—often, but not always, 50 ohms). With low device impedance and a higher 'outside world' (e.g. 50 ohms) a low-pass network having the most bandwidth capability will have the capacitors manifested in that value-stepped fashion. An actual design may not manifest this because a 'pure' low-pass section may not be used, or a combination of the DC supply voltage and required Power Out from the amplifier may 'flip' the order of which direction is 'high-impedance' and which direction is 'low-impedance'. Then, if a pure low-pass section is employed having the best bandwidth capability, the direction of ascending or descending capacitive contributions would also 'flip' or mirror from the example shown.

Network 320 (corresponding to the harmonic components of the output current) in an analogous manner generates the complex loading and sets the slopes of the corresponding [multiple] load-lines for harmonics of interest for the case at hand. Based on the characteristics of the amplifier apparatus as described above, an ideal $I_d$ waveform would be rich in even harmonics (for the specific case of our example), with energy at the odd harmonics much reduced. A Fourier analysis shows that the even harmonics become less prominent in amplitude with higher order. Using these facts and the 150 MHz design frequency encompassing a 1 GHz transistor device, it may be determined that handling the second and fourth harmonics would be sufficient to wave-shape the $V_{ds}$ waveform and achieve the overall goal of preventing device destruction.

This is accomplished using network portions 322 and 324, which have primary functions or impact of setting or dominating $4^{th}$ harmonic and $2^{nd}$ harmonic load-line slopes, respectively. Portion 324 comprises capacitors C3 and C4 coupled together and to network 310 as indicated in FIG. 5. Referring again briefly to FIG. 4, network portion 324 primarily (but usually not exclusively) determines the slope of the second harmonic load-line 406. The steeper that 406 is made, the smaller the resulting amplitude of the corresponding voltage component—124 in this case—will be. Though not shown in FIG. 4 the same is done for the $4^{th}$ harmonic and is accomplished within network 320 in FIG. 5 by network portion 322. Portion 322 comprises capacitors C1 and C2 coupled together and to network portion 324 as indicated in FIG. 5 (e.g. via an inductive element that in this embodiment is a transmission line element T1).

It should be noted that, desirably the capacitive values of the capacitive elements in network 320 increase as the distance or proximity (topologically) of the capacitive element from the PA device increases. This is related to sensitivity of the total terminal impedance across the terminals of a capacitor to the specific harmonic that it may be addressing. The highest harmonics of need must be addressed closest to the power-device as discussed elsewhere in this embodiment. It is the product of frequency and capacitance that dominate the control of the impedance loading (and therefore load-line slope) for a specific such harmonic. Since we in the described embodiments make these load lines all fairly steep, it follows that higher harmonic frequency-control (higher frequencies) will be associated with correspondingly smaller values of capacitive elements to achieve the same effect (load-line slope). As alluded, relative network placement position from the device was already discussed. When output network 304 is designed sufficiently-well and all elements are optimized, the wave-shaped waveform of FIG. 6, item 610 is the [desired] result.

Those skilled in the art of power amplifier design will realize that implementations of network 310 need not look (have the exact topology) as 310 as shown in FIG. 5—they just need to have the primary purpose of matching at the fundamental frequency. This matching section is primarily responsible for generating the [complex] loading impedance for the power amplifier device—and in doing so, setting the slope of the load line at the plane of the device at the fundamental frequency. Likewise, implementations of network 320 need not look (have the exact topology) as 320 as shown in FIG. 5—they just need to have the primary purpose of matching at the harmonic frequency or frequencies of interest. This matching section is primarily responsible for setting the slope(s) of the load line(s) at the plane of the device at the harmonic frequency or frequencies.

In this example it was necessary to focus on even harmonics as a practical manner of solution. This was tightly coupled to the characteristic of a class B amplifier operation, and with that operation not heavily compressed (i.e. gain compression vs. RF drive). If an amplifier is biased differently or is run hard into compression it is entirely possible that some other combination of harmonics (to include 'odds') will be of primary importance to consider in applying the teachings herein and is, thus, included within the scope of the present teachings.

Figure 7:
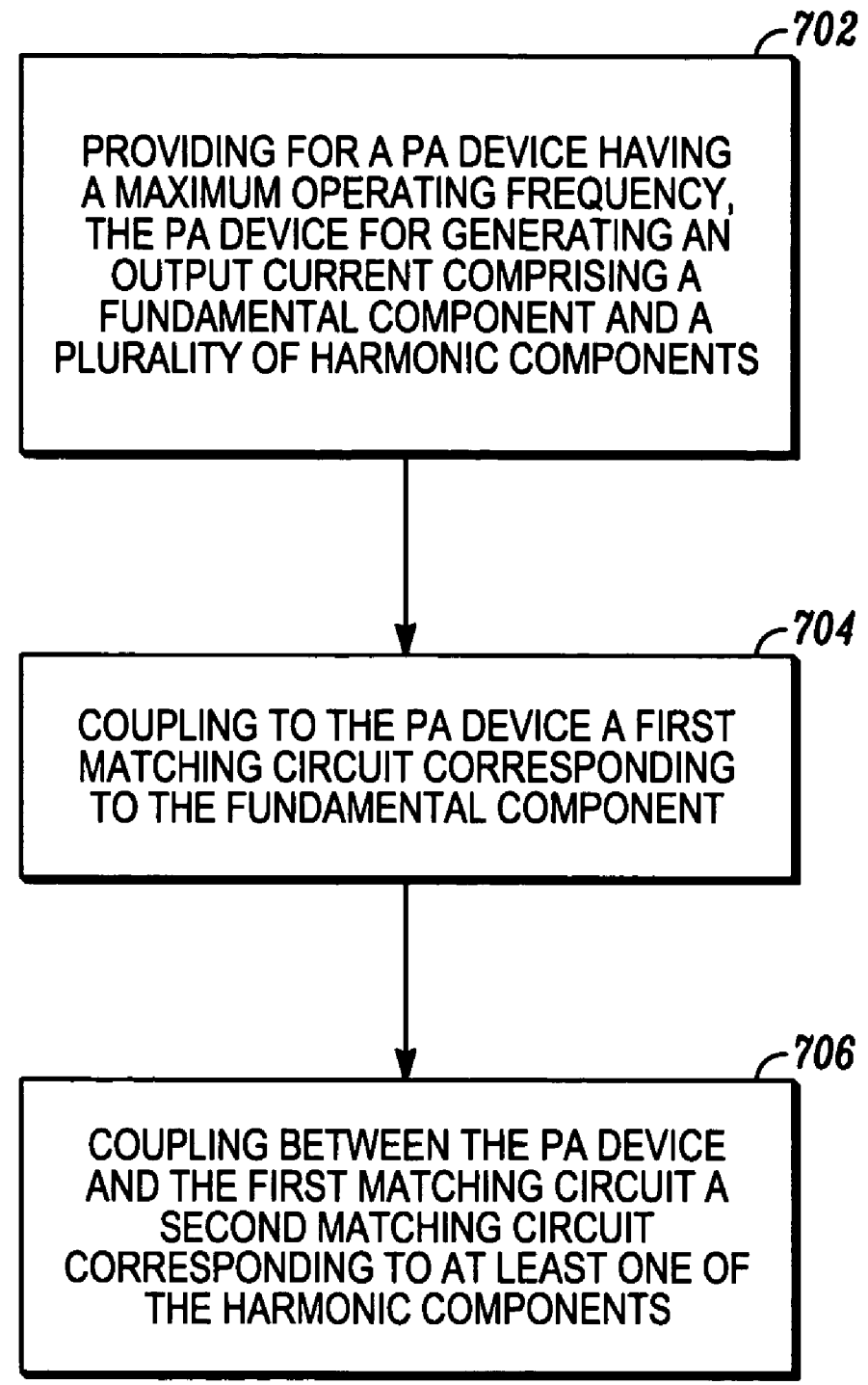
FIG. 7 illustrates a method for manufacturing power amplifier apparatus in accordance with embodiments of the present invention.

FIG. 7 illustrates a flow diagram of a method 700 for manufacturing apparatus in accordance with embodiments of the present invention. At a step 702, a PA device (e.g., 302) is provided for. The PA device can be any suitable PA device as is desirable for a given application which has a maximum operating frequency and in operation generates an output current comprising a fundamental component at a fundamental frequency that is lower than the maximum operating frequency and a plurality of harmonic components each at a different harmonic frequency of the fundamental frequency. At a step 704, a first matching circuit designed to correspond to or dominate the fundamental component is coupled to the PA device, and at a step 706 a second matching circuit designed to correspond to or dominate at least one of the harmonic components is coupled between the PA device and the first circuit. The first and second matching circuits are further designed to maintain a voltage generated at the PA device output at an acceptable level, e.g., no more then a maximum value that is less than a breakdown voltage of the PA device. It should be noted that the above steps can be performed to generate a single instance of PA apparatus or ideally for mass production of such PA apparatus using conventional IC and electronic circuit board manufacturing facilities.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

What is claimed is:

1. Power amplifier (PA) apparatus comprising:
   a PA device operating at a fundamental frequency and having a maximum operating frequency that is higher than the fundamental frequency, an output current comprising a fundamental component at the fundamental frequency and a plurality of harmonic components at different harmonic frequencies of the fundamental frequency, and an output voltage based on the output current;
   a first matching circuit coupled to the PA device and corresponding to the fundamental component; and
   a second matching circuit coupled between the PA device and the first matching circuit and corresponding to a plurality of the harmonic components, wherein the second matching circuit comprises a plurality of matching portions operatively coupled together, with each matching potion corresponding to a different harmonic component of the output current, wherein the higher the harmonic frequency of the harmonic component, the closer its corresponding matching portion is coupled to the PA device, wherein the first and second matching circuits maintain the PA output voltage at a value that is no more than a predetermined maximum value, which is less than a breakdown voltage for the PA device.

2. The PA apparatus of claim 1, wherein the PA device is included in an integrated circuit.

3. The PA apparatus of claim 1, wherein the PA device comprises a final stage PA.

4. The PA apparatus of claim 1, wherein the PA device comprises a power field effect transistor (FET).

5. The PA apparatus of claim 4, wherein the power FET comprises a lateral diffused metal-oxide-semiconductor transistor.

6. The PA apparatus of claim 1, wherein the second matching circuit corresponds only to even harmonic components of the output current.

7. The PA apparatus of claim 6, wherein the even harmonic components comprise the second and fourth harmonic components of the output current.

8. The PA apparatus of claim 1, wherein the second matching circuit corresponds to even and odd harmonic components of the output current.

9. The PA apparatus of claim 1, wherein the first and second matching circuits comprise a plurality of inductive elements and capacitive elements operatively coupled together.

10. The PA apparatus of claim 9, wherein capacitive elements comprising the second matching circuit have capacitive values that increase as the distance of the capacitive element from the PA device increases.

11. The PA apparatus of claim 10, wherein capacitive elements comprising the first matching circuit have capacitive values that decrease as the distance of the capacitive element from the PA device increases.

12. A manufacturing method for power amplifier (PA) apparatus comprising:

providing for a PA device having a maximum operating frequency, the PA device for being operated to generate an output current comprising a fundamental component at a fundamental frequency that is less than the maximum operating frequency and a plurality of harmonic components at different harmonic frequencies of the fundamental frequency and for generating an output voltage based on the output current;

coupling to the PA device a first matching circuit designed to correspond to the fundamental component; and coupling between the PA device and the first matching circuit a second matching circuit designed to correspond to a plurality of the harmonic components, wherein the second matching circuit comprises a plurality of matching portions operatively coupled together, with each matching portion corresponding to a different harmonic component, of the output current, wherein the higher the harmonic frequency of the harmonic component, the closer its corresponding matching portion is coupled to the PA device, wherein the first and second matching circuits are designed to maintain the PA output voltage at a value that is no more then a predetermined maximum value, which is less than a breakdown voltage for the PA device.

13. A power amplifier (PA) apparatus design method comprising:

determining a minimum operating frequency of a PA device and a maximum operating frequency of the PA device;

designing a first matching network for the PA device operating at a fundamental frequency that is within the maximum and minimum operating frequencies, wherein the PA device has an output current during operation comprising a fundamental component at the fundamental frequency and a plurality of harmonic components at different harmonic frequencies of the fundamental frequency, and the PA device has an output voltage during operation based on the output current;

designing a second matching circuit to minimize, to a non-zero value, at least one of the harmonic components;

wherein the first and second matching circuits are designed to waveshape the PA output voltage to within a value that is less than a breakdown voltage for the PA device.

14. The method of claim 13, wherein a difference between the maximum and minimum operating frequencies is at least one octave.

15. The method of claim 13, wherein the at least one harmonic component that the second matching circuit is designed to minimize is determined based on the difference between the maximum and minimum operating frequencies.

* * * * *